United States Patent [19]

Nakajima et al.

[11] Patent Number: 5,316,831
[45] Date of Patent: May 31, 1994

[54] METALLIC PRINTED BOARD

[75] Inventors: Yukio Nakajima; Kazuhiko Imamura; Ryozo Karatsu, all of Kawasaki; Sumio Nishizaki; Makoto Kobayashi, both of Shimotsuga, all of Japan

[73] Assignee: Fuji Electric Co., Ltd., Kanagawa, Japan

[21] Appl. No.: 879,009

[22] Filed: May 6, 1992

[30] Foreign Application Priority Data

May 8, 1991 [JP] Japan .................. 3-101681
Dec. 24, 1991 [JP] Japan .................. 3-340923

[51] Int. Cl.⁵ .................................. B32B 9/00
[52] U.S. Cl. ...................... 428/209; 428/210; 428/901
[58] Field of Search .............. 428/209, 901, 210

[56] References Cited

U.S. PATENT DOCUMENTS

| | | | |
|---|---|---|---|
| 3,491,197 | 1/1970 | Walkow | 174/68.5 |
| 4,770,921 | 9/1988 | Wacker et al. | 428/209 |
| 4,792,646 | 12/1988 | Enomoto | 174/68.5 |
| 4,933,228 | 6/1990 | Katagiri et al. | 428/209 |
| 5,079,065 | 1/1992 | Masakazu et al. | 428/137 |

FOREIGN PATENT DOCUMENTS

| | | |
|---|---|---|
| 0048992 | 4/1982 | European Pat. Off. |
| 696185 | 8/1953 | United Kingdom |
| 2133934 | 8/1984 | United Kingdom |
| 2208971 | 4/1989 | United Kingdom |

Primary Examiner—Patrick J. Ryan
Assistant Examiner—Cathy K. Lee
Attorney, Agent, or Firm—Spencer, Frank & Schneider

[57] ABSTRACT

A metallic printed board having layers including a metallic plate, an electric insulating layer and a metallic film, includes a plurality of insulating regions in the electric insulating layer. The insulating regions have different dielectric or thermal properties and are formed of a number of kinds of electric insulating materials having the different dielectric or thermal properties respectively. The insulating regions are arranged on an identical plane surface of the metallic plate.

11 Claims, 7 Drawing Sheets

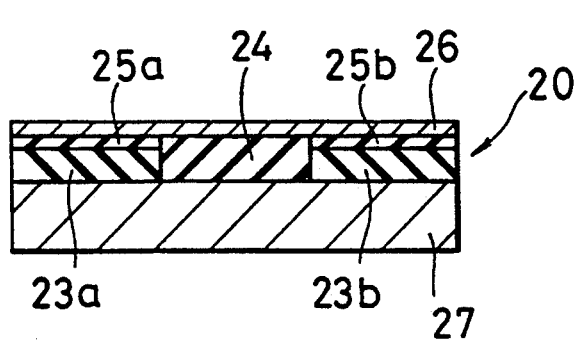
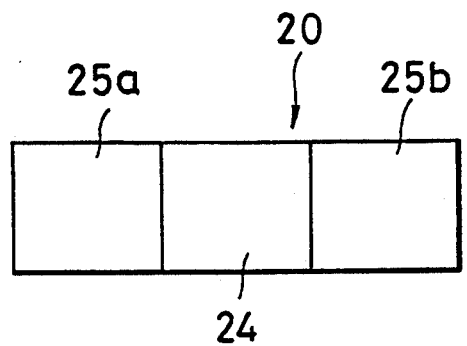
FIG.10A          FIG.10B
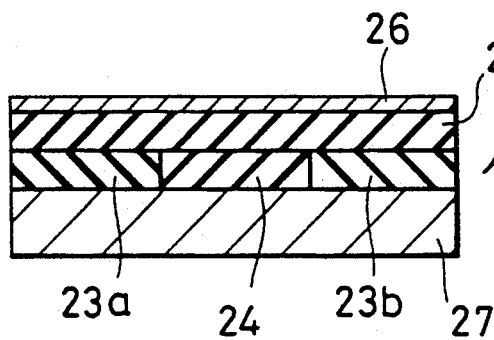
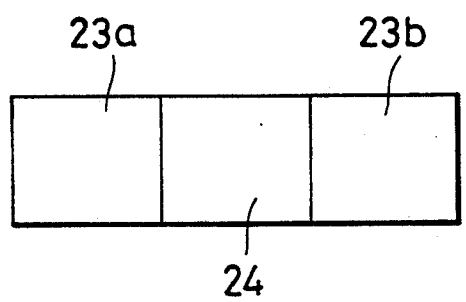
FIG.11A          FIG.11B
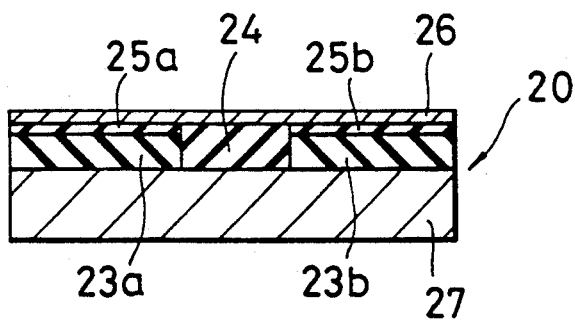
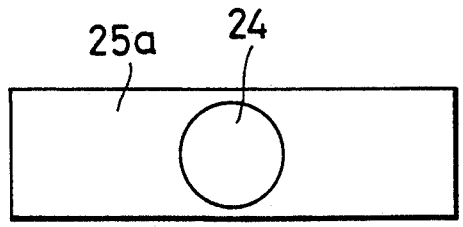
FIG.12A          FIG.12B

METALLIC PRINTED BOARD

BACKGROUND OF THE INVENTION

1. Field of the Invention

The present invention relates to a metallic printed board and in particular to a metallic printing board having a multiple layer structure including a metallic plate, an electric insulating material layer and a metallic film.

2. Description of the Prior Art

As for prior art metallic printed boards (called metallic boards), electric insulating materials developed on an identical surface on the metallic board are composed of a single kind of material. Regions on which electronic circuits are defined on the metallic board are formed either only on a single side surface of the metallic board or on both side surfaces of the metallic board, but both of these single-sided regions and double-sided regions are not simultaneously placed on the metallic board. In addition, the metallic board is never used as a case of the apparatus using the metallic board or a structural member of the apparatus. FIGS. 1, 2, 3 and 4 illustrate the exemplary structure of the above described prior art metallic board.

FIG. 1 shows a layout where two individual circuits having different specifications are developed on individually separated metallic boards and the separated metallic boards are connected to each other by cables. With respect to insulating materials, the metallic board 1 may be a member with low dielectric constant and the metallic board 2 may be a member with low thermal resistance. Connectors 9 are mounted on the metallic boards 1 and 2, between which cables 10 are connected.

FIG. 2 shows a cross-sectional view of an apparatus in which two kinds of metallic boards with different properties are installed. In FIG. 2, the low thermal resistance metallic board 2 and a complementary board 11 are placed separately and connected by the spacer-f 20, and screws 21 fix the boards 2 and 11 at the spacers 20. In order to obtain heat radiation efficiency, a metal plate of the metallic board 2 is placed in contact with the metallic case 12.

FIG. 3 shows a cross-sectional view of the metallic board where the metallic board 2 is formed as a single-sided packaging board to be contacted to the cooling fins 14. FIG. 4 is a cross-sectional view of the metallic board where the metallic board 15 is formed as a double-sided packaging board and he be fixed to the metallic case 12 by screws 22.

In the above described prior art metallic boards, insulating materials thereof are composed of a single kind of material. Since the insulating material used for the metallic board is selected by considering its specific purposes and specifications with respect to used voltages, frequencies, and power losses, the metallic board is formed individually to satisfy specific requirements. For this reason, the following problems occur.

(1) In forming circuits with different specifications, various kinds of metallic boards separated in relatively small sizes are required in a single frame of an apparatus.

(2) Heat transmission for releasing generated heat cannot be fully established in separated metallic boards, and therefore, cooling fans are necessary for metallic boards which generate relatively large amounts of heat due to power losses, which leads to enlarging the size of the apparatus.

(3) A single-sided metallic board has a relatively high heat radiation efficiency, but the device packaging density is low. On the other hand, as for a double-sided metallic board, the device packaging density is relatively high, but the heat radiation efficiency is not relatively high, and therefore heat Iq removal devices are necessary at both ends of the metallic board which may lead to scaling up of the metallic board itself. Anyway, reducing the size of either metallic board is restricted.

(4) The size of the case for housing the various kind of metallic boards simultaneously increases.

(5) The increased number of connection parts such as connectors and cables due to the increased number of separated metallic boards may give rise to a relative reduction of the overall reliability of the apparatus.

In addition to the above described packaging problems where the insulating materials for the metallic board can only be of a single kind, mechanical problems generic to the metallic board itself may occur for the similar reasons. In using a single kind of material for the insulating materials of the metallic board, the heat radiation efficiency and the heat-proof capability cannot be optimized at the same time, that is they must be traded off. More specifically, in considering the optimization of the heat radiation efficiency, it is required to increase the content of filling materials used for the insulating materials in comparison with resin, which is the major content of the insulating materials. In this case, as the content of resin is reduced, structural defects such as pin holes may tend to occur, and the voltage margin they can withstand may be reduced. In case of increasing the content of resin, the voltage margin may be increased and the heat radiation efficiency may be reduced leading to generation of large amount of thermal strain during a heat hardening process of the resin to bend the board.

SUMMARY OF THE INVENTION

An object of the present invention is to provide a metallic printed board which can enhance a rate of mounting the metallic board in the apparatus and the efficiency of heat radiation from the metallic board mounted in the apparatus, the ease of connecting the metallic boards, and the miniaturization of the apparatus housing accommodating the metallic boards and which has a higher efficiency of heat radiation and a higher voltage resistance.

In the first aspect of the present invention, a metallic printed board having a metallic plate, an electric insulating material and a metallic film, comprises:

a plurality of insulating regions having different properties being formed by arranging a plurality of kinds of the electric insulating material having different properties on an identical plane surface formed by the metallic plate.

Here, a plurality of circuits having different specifications may be arranged on an identical board corresponding to each of a plurality of insulating regions formed by the electric insulating material having different properties.

A circuit having a relatively large power loss may be formed on an insulating region having a relatively small thermal resistance of a plurality of insulating regions, and a circuit having a relatively smaller power loss is formed on an insulating region having a thermal resistance relatively larger than the small thermal resistance.

The printed circuit board may have a structure comprising two kinds of device mounting parts including a single-sided part and a double-sided part, and a radiation fin is contacted to the single-sided part so that a thermal resistance of the single-sided part is reduced.

The printed circuit board may be bent at a designated position and used as a case or part of the structure of the case.

In the second aspect of the present invention, a metallic printed board having a multiple layer structure including a metallic plate, an electric insulating material and a metallic film comprises:

a first insulating layer formed as the electric insulating material being composed of a glass non-textile fiber in which a mixture of resin and inorganic filling materials including aluminum oxide of between 50 parts and 70 parts by weight, silicon dioxide of between 1 part and 10 parts by weight, magnesium silicate of between 1 part and 10 parts by weight and thermoset resin of between 1 part and 10 parts by weight, is coated; and a second insulating layer formed as the electric insulating material and developed so as to form a single surface together with the first insulating layer, the second insulating layer being composed of a glass non-textile fiber in which a mixture of resin and inorganic filling materials including aluminum hydroxide of between 10 parts and 20 parts by weight, magnesium silicate of between 10 parts and 20 parts by weight, silicon dioxide of between 1 part and 5 parts by weight and thermoset resin of between 60 parts and 80 parts by weight, is coated.

In the third aspect of the present invention, a metallic printed board having a multiple layer structure including a metallic plate, an electric insulating material and a metallic film comprises:

a first insulating layer formed as the electric insulating material being composed of a glass non-textile fiber in which a mixture of resin and inorganic filling materials including aluminum oxide of between 50 parts and 70 parts by weight, silicon dioxide of between 1 part and 10 parts by weight magnesium silicate of between 1 part and 10 parts by weight and thermoset resin of between 1 part and 10 parts by weight, is coated;

a second insulating layer formed as the electric insulating material and developed so that the second insulating layer may be close to the first insulating layer and a height of the second insulating layer may be smaller than a height of the first insulating layer, the second insulating layer being composed of a glass non-textile fiber in which a mixture of resin and inorganic filling materials including aluminum hydroxide of between 10 parts and 20 parts by weight, magnesium silicate of between 10 parts and 20 parts by weight, silicon dioxide of between 1 part and 5 parts by weight and thermoset resin of between 60 parts and 80 parts by weight, is coated; and a third insulating layer formed as the electric insulating material and developed so as to form a single surface together with the first insulating layer and on the second insulating layer, the third insulating layer being composed of an aromatic polyamide non-textile fiber coated with a thermoset resin.

In the fourth aspect of the present invention, a metallic printed board having a multiple layer structure including a metallic plate, an electric insulating material and a metallic film comprises:

a first insulating layer formed as the electric insulating material being composed of a glass non-textile fiber in which a mixture of resin and inorganic filling materials including aluminum oxide of between 50 parts and 70 parts by weight, silicon dioxide of between 1 part and 10 parts by weight, magnesium silicate of between 1 part and 10 parts by weight and thermoset resin of between 1 part and 10 parts by weight, is coated;

a second insulating layer formed as the electric insulating material and developed so as to form a single surface together with the first insulating layer, the second insulating layer being composed of a glass non-textile fiber in which a mixture of resin and inorganic filling materials including aluminum hydroxide of between 10 parts and 20 parts by weight, magnesium silicate of between 10 parts and 20 parts by weight, silicon dioxide of between 1 part and 5 parts by weight and thermoset resin of between 60 parts and 80 part by weight, is coated; and a third insulating layer formed as the electric insulating material and on the single surface defined by the first insulating layer and the second insulating layer, the third insulating layer being composed of an aromatic polyamide non-textile fiber coated with a thermosetting resin.

In case of mounting circuits on the metallic circuit board, as shown above, the characteristics of the electrically insulating materials used for the metallic circuit board should be matched with specifications of the circuits established on the metallic circuit board. For example, if the voltage developed in the circuit is high, the insulating materials should have a higher insulating effect. If the signal frequency in the circuits is high, the dielectric constant of insulating materials should be lowered. In addition, if the power loss of the circuits is high, the thermal conductivity of insulating materials should be lowered and some means for radiating heat such as cooling fans is required. For these reasons, in using conventional metallic boards which use a single material for electric insulating parts, individually separated circuit boards have to be prepared for establishing specific circuit functions.

In the present invention, wherein a plurality of insulating materials each of which has an insulating characteristic matched with the specifications of each of the circuits formed on the metallic board respectively, are disposed, as an insulating layer formed between the metallic plate and the metallic film of the metallic board, on an identical face of the metallic plate without considering whether a single insulating material is used or complex insulating materials are used, a plurality of circuits having their own functions and specifications can be installed on a single metallic circuit board without separating metallic boards corresponding to individual circuit functions and specifications.

As a result, connection parts such as connectors and cables between separated circuit boards required in prior art apparatus are not necessary in the present invention. In addition, as the temperature distribution on the metallic board can be made uniform due to the metallic plate conducting heat effectively, local temperature peaking can be prevented even if the metallic board partly includes circuits with high power losses. And also, as heat to be radiated from the metallic board can be relatively reduced, the metallic plate can be used as a heat radiator, and hence, specific cooling fins can be eliminated or their sizes can be reduced. It may be possible that both single-sided device packaging parts and double-sided device packaging parts, both sharing a single metallic plate, are formed on the metallic board and that a cooling fan is mounted on the single side of the metallic plate. In this case, the device packaging density and the heat radiation efficiency can be increased and the size of the metallic board can be further reduced. By forming the metallic board so that the metallic board may be bent, the metallic plate of the metallic board can be used as a part of the case of the apparatus and the size of the case of the apparatus can be eventually reduced.

And furthermore, in another aspect of the present invention, from the view point of the voltage margin it can withstand, the content of thermoset resin used in the second insulating layer is determined to be between 60 parts and 80 parts by weight. This is because, if the content of the thermoset resin is less than 60 parts by weight, a large enough voltage margin cannot be established, and because the content of thermoset resin is greater than 80%, enough heat radiation efficiency cannot be obtained. Though the higher voltage margin can be obtained by increasing the content of thermoset resin, as for the insulating layer with higher voltage margin, contacted to the insulating materials having higher thermal conductivities and formed together on an identical surface of the metallic plate, where major components of the insulating materials are thermoset resin and filling materials, the content of the thermoset resin is between 60 parts and 80 parts by weight. On the other hand, as for the first insulating layer, where higher heat radiation efficiency is required, the content of filling materials is taken to be greater than or equal to 60 parts by weight, in which case the voltage margin is reduced to a certain extent.

In the present invention, the contents of inorganic filling materials, that is, aluminum oxide, silicon dioxide, magnesium silicate and thermoset resin are selected for the following reasons.

The tensile modules of elasticity of the first insulating layer forming a part of the insulating materials is between 1100 and 1800 kgf/mm$^2$, and what is required for the first insulating layer is a higher rigidity and a lower thermal expansion ratio as well as higher thermal conductivity, and higher glass transition temperature (Tg). In the measurement of Tg, glass transition temperature, and the thermal expansion coefficient of a metallic printed board, where the metallic plate is a 1.5 mm thick plate of aluminum, the metallic film is a 0.035 mm thick film of copper, and between the aluminum plate and the copper film, the first, second and third insulating layers are formed, Tg of the first insulating layer is 140° C. and the thermal expansion coefficient is between 1.61 and 5.9×10$^{-5}$/° C. The tensile modulus of elasticity of the second and third insulating layers is between 600 and 900 kgf/mm$^2$, Tg of the second and third insulating layers is 100° C., and the linear thermal expansion coefficient is between 1.5 and 3.8×10$^{-5}$/° C. relatively higher flexibility of materials.

In case of forming the above first, second and third insulating layers on an identical surface, when the first insulating layer is heated excessively, with the higher TG (140° C.) and the lower linear thermal expansion coefficient (between 1.61 and 5.9×10$^{-5}$/° C.), the bending or distorted deformation of the metallic board may be prevented. At this time, Tg of the second and third insulating layers is 100° C., the linear thermal expansion coefficient of them is 3.8×10$^{-5}$/° C., and the linear thermal expansion coefficient of the first insulating layer contacting to the second insulating layer is 2.77×10$^{-5}$/° C. The linear thermal expansion coefficient of aluminum used as metallic plate is 2.4×10$^{-5}$/° C. So far, the linear thermal expansion coefficient may be varied from one material to other materials.

The first insulating layer can obtain a high thermal conductivity if the content of aluminum oxide composed in the first insulating layer is determined to be between 50 parts and 70 parts by weight. However, in this weight ratio, the tensile modulus of elasticity of the first insulating layer is relatively high because the rigidity of resin is increased by adding aluminum oxide. Therefore, silicon dioxide and magnesium silicate are added into the first insulating layer by between 1 part and 10 parts by weight as well as aluminum oxide so that the first insulating layer may have flexibility and rigidity at the same time. The ratio of the content of these inorganic filling materials to that of thermoset resin is at most 80:20 with respect to an effective use of the mechanical properties of these inorganic filling materials.

The contents of the second and third insulating layers can be determined in a similar manner to that of the first insulating layer. With respect to the second insulating layer, aluminum hydroxide is required for flame deterrent properties, magnesium silicate is required for flexible mechanical properties and silicon dioxide is required for electric properties and rigid mechanical properties. The contents of these inorganic filling materials may be determined as described above so as to make the best use of each inorganic filling materials. The ratio of the content of these inorganic filling materials to that of thermoset resin is at most 80:20 with respect to an effective use of the mechanical properties of these inorganic filling materials.

The above and other objects, effects, features and advantages of the present invention will become more apparent from the following description of embodiments thereof taken in conjunction with the accompanying drawings.

BRIEF DESCRIPTION OF THE DRAWINGS

FIGS. 10A and 10B are a cross-sectional view and a plan view of a metallic board of sixth embodiment of the present invention, respectively;

FIGS. 11A and 11B are a cross-sectional view and a plan view of a metallic board of seventh embodiment of the present invention, respectively;

FIGS. 12A and 12B are a cross-sectional view and a plan view of a metallic board of eighth embodiment of the present invention, respectively;

DESCRIPTION OF THE PREFERRED EMBODIMENTS

Now, referring to FIGS. 5, 6, 7, 8, 9, 10, 11, 12, 13 and 14, the first to the tenth embodiments of the present invention will be described. Each embodiment of the present invention and its corresponding prior art is shown in pairs of FIGS. 6 and 1, FIGS. 7 and 3, FIGS. 8 and 2, and FIG. 9, 3 and 4, where like parts having identical functions are designated same numbers.

First Embodiment

Figure 5B:
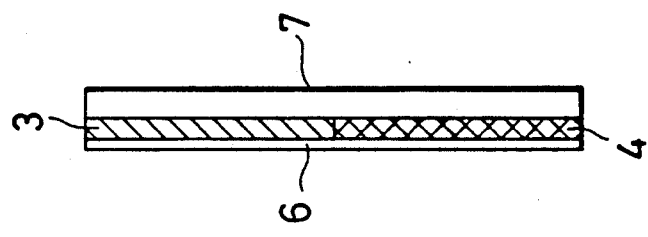
FIGS. 5A and 5B are a plan view and a cross-sectional view of a metallic board of the first embodiment of the present invention, respectively.
Figure 5A:
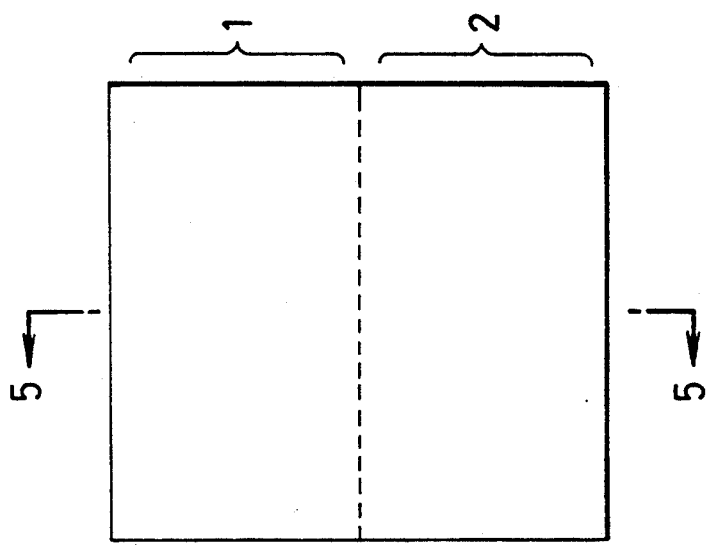

FIG. 5A is a plan view of a single-sided metallic board having a cross-sectional view on an 5–5 line shown in FIG. 5B. In this embodiment, a metallic board is composed of a metallic board 1 having lower dielectric constant and a metallic board 2 having lower thermal resistance, the boundary line between which is shown by a straight broken line in FIG. 5A. In FIG. 5B, component 3 is an insulating material having lower dielectric constant such as glass epoxy resin piled up on a region corresponding to the metallic board 1, and component 4 is an insulating material having lower thermal resistance such as filler epoxy resin piled up on a region corresponding to the metallic board 2, both insulating materials formed commonly between the copper film 6 and the metallic plate 7 by vacuum heating press method.

Second Embodiment

Figure 1:
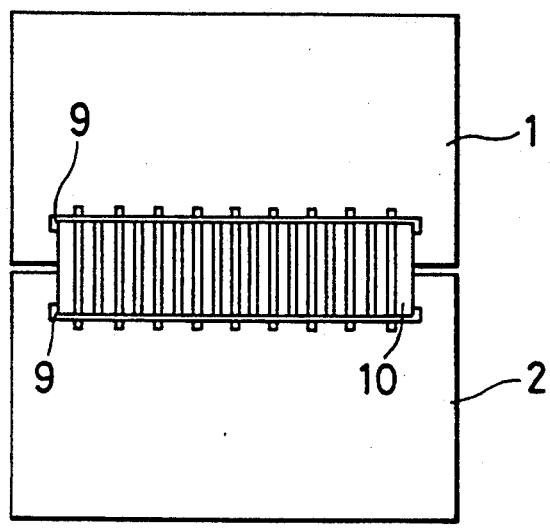
FIG. 1 is a plan view showing an exemplary layout of a couple of prior art metallic boards.
Figure 6:
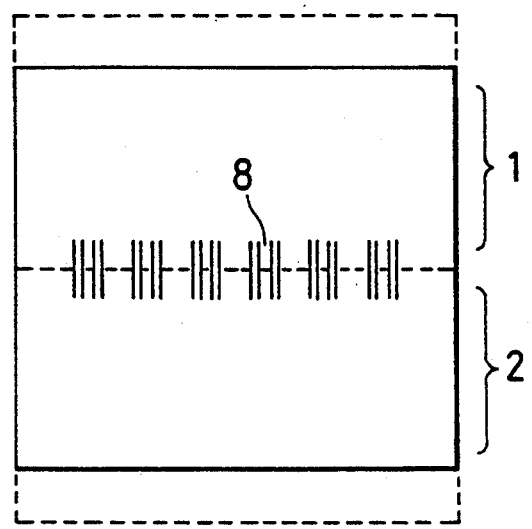
FIG. 6 is a plan view showing a connection pattern of a circuit on a metallic board of second embodiment of the present invention.

FIG. 6 shows a pattern layout in a case where individual circuits are formed on metallic boards 1 and 2 shown in FIGS. 5A and 5B and that patterns 8 are formed between the above circuits by the copper film 6. As found in FIG. 6, connectors 9 and cables 10 in the prior art shown in FIG. 1 are not required, and the rectangle defined by the two connected metallic boards 1 and 2 is smaller than the rectangle required for accommodating the prior art metallic boards of FIG. 1 which is shown by broken lines in FIG. 6.

Third Embodiment

Figure 7:
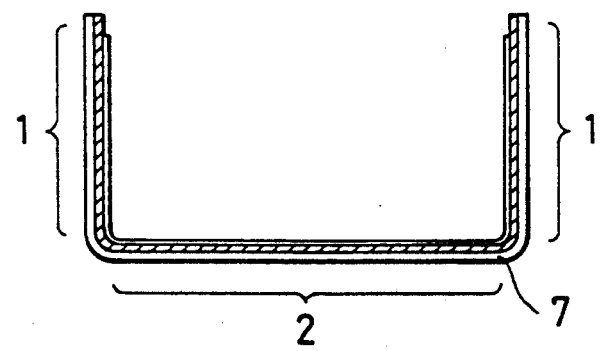
FIG. 7 is a cross-sectional view of a metallic board of third embodiment of the present invention.

FIG. 7 is a cross-sectional view of the metallic board in the case of mounting the above described metallic board 1 shown in FIGS. 5A and 5B vertically on both ends of the above described metallic board 2 shown in FIGS. 5A and 5B. In this case, circuits having larger power losses defined on the metallic board 2 and circuits having smaller power losses are defined on the metallic board 1, and so far, heat transmission from the metallic board 2 to the metallic board 1, that is, from circuits with larger power loss to circuits with smaller power loss, brings a uniform temperature distribution. Owing to heat emission from all the areas of the metallic boards 1 and 2, cooling fins 14 shown in FIG. 3 can be eliminated. The thermal resistance of the insulating part of the metallic board I is greater than that of the insulating part of the metallic board 2.

Fourth Embodiment

Figure 2:
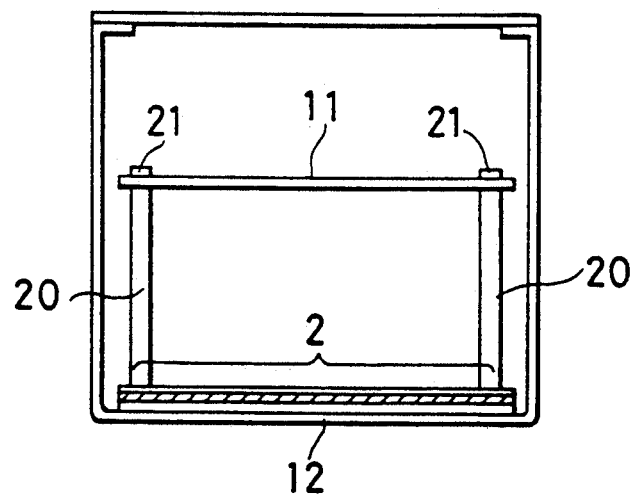
FIG. 2 is a cross-sectional view of an apparatus case using a prior art metallic board.
Figure 8:
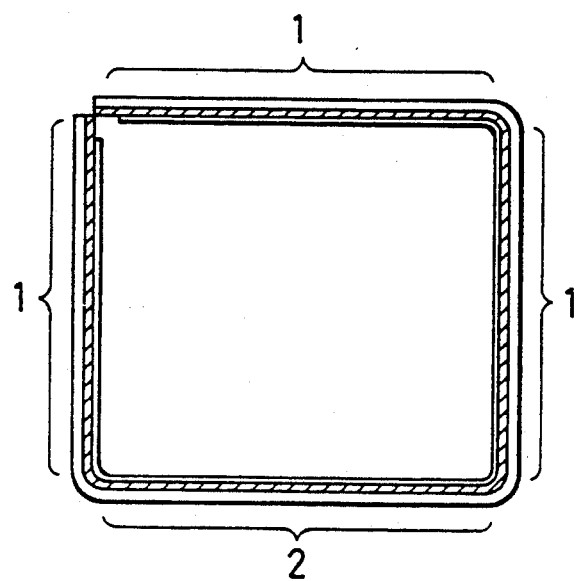
FIG. 8 is a cross-sectional view of a metallic board of fourth embodiment of the present invention.

FIG. 8 is a cross-sectional view of the metallic board in a case where circuits previously developed on separated prior art metallic board 2 and supplementary board 11 as shown in FIG. 2 are now defined on a single metallic board which is formed by combining the metallic boards 1 and 2 with an identical single metallic plate and an identical single metallic film and shaped into an empty open box with its four faces defined by metallic boards 1, 2, 1 and 1 a in counterclockwise direction, which is used as a metallic board as well as an apparatus case. In comparison with the prior art shown in FIG. 2, the circuit board structure and the apparatus frame structure are simplified in this case.

Fifth Embodiment

Figure 3:
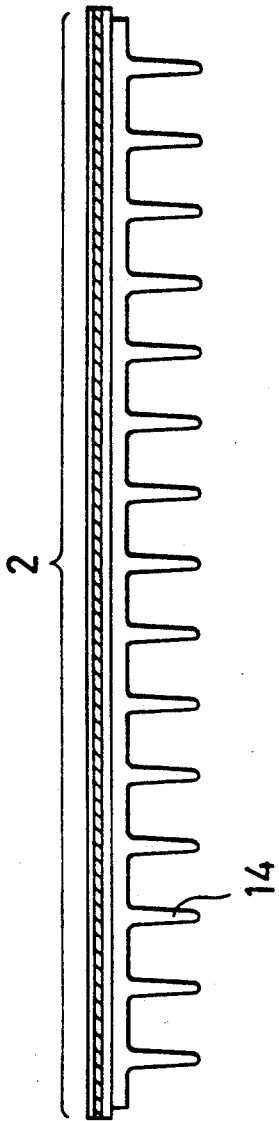
FIG. 3 is a cross-sectional view showing a cooling structure of prior art metallic board.
Figure 4:
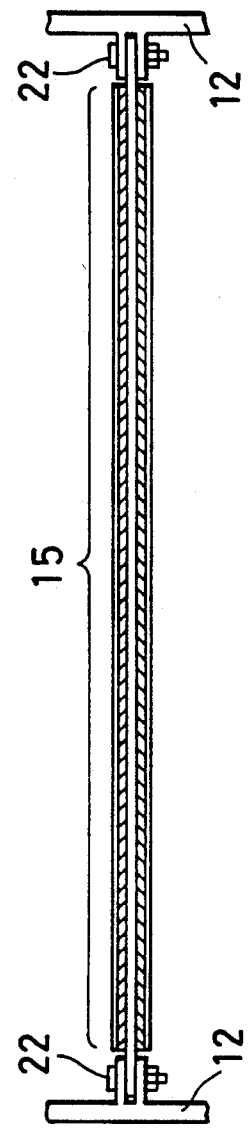
FIG. 4 is a cross-sectional view showing an exemplary structure of prior art metallic board.
Figure 9:
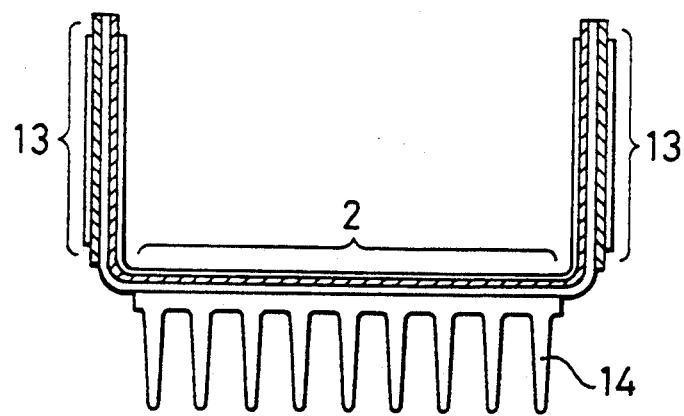
FIG. 9 is a cross-sectional view of a metallic board of fifth embodiment of the present invention.

FIG. 9 is a cross-sectional view of the metallic board in a case where, integrating the prior art single-sided metallic board 2 having cooling fins 14 and the prior art double-sided metallic board 15 as shown in FIGS. 3 and 4, respectively, a metallic board having a single metallic plate is formed by a couple of double-sided metallic boards 13 having lower dielectric constant is disposed on both sides of the metallic board 2 by bending the single metallic plate at right angles. The configuration of prior art metallic boards with different heat radiation properties shown in FIGS. 3 and 4, where metallic boards are separately mounted, is not necessary, and hence, mounting of metallic boards can be simplified.

Sixth Embodiment

FIGS. 10A and 10B are a cross-sectional view of the metallic printed board and a plan view of its insulating layer, respectively, both with the sixth embodiment of the present invention. In FIGS. 10A and 10B, component 27 is a 1.5 mm thick metallic plate of copper. Above the metallic plate 27, a 0.035 mm thick copper film 26 is formed and a 0.25 mm thick insulating layer 20 is formed between the metallic plate 27 and the copper film 26. The insulating layers 20 are defined by the first insulating layer 24 having 0.25 mm thickness and composed of low thermal resistance insulating materials which is formed at the center of the metallic board, and by the second insulating layers 23a and 23b having a thickness less than that of the first insulating layer 24, which are composed of low dielectric constant insulating materials and are formed on the both sides of the first insulating layer 24, and on which are formed the third insulating layers 25a and 25b having 0.10 mm thickness.

The first insulating layer 24 is composed of glass non-textile fiber ($50g/m^2$) in which a mixture of inorganic filling materials and resin is coated. The mixture is made in such a manner that thermoset epoxy resin A (100 parts by weight), constituents of which are described below, is mixed with inorganic filling materials, that is, aluminum oxide (200 parts by weight), silicon dioxide (15 parts by weight) and magnesium silicate (15 parts by weight). The second insulating layers 23a and 23b are composed of the glass non-textile fiber ($50g/m^2$) in which a mixture of inorganic filling materials and resin is coated. The mixture of the second insulating layers is made in such a manner that thermoset epoxy resin B (100 parts by weight), constituents of which are described below, is mixed with inorganic filling materials, that is, aluminum hydroxide (200 parts by weight), silicon dioxide (10 parts by weight) and magnesium silicate (10 parts by weight). The third insulating layers 25a and 25b are composed of aromatic polyamide non-textile fiber with epoxy resin B coating. Instead of epoxy resin B used for the third insulating layers, epoxy resin A used for the first insulating layers may be used for the third insulating layers. The coating amount of the mixture in the glass non-textile fiber is dependent on the thickness of the insulating layers, and for example, 350 to 450 g/m² coating material is required for establishing 0.25 mm thickness.

The epoxy resin A is aimed at increasing the heat-proof property and thermal conductivity of materials. In compounding resin A, the ratio of the content of bismule-imide-tri-azin resin to that of bisphenol epoxy resin, is between 20 parts and 60 parts by weight so as to increase glass transition temperature and the heat-proof property of resin A. Additive filling materials such as aluminum hydroxide may contribute to the reduction of the heat expansion ratio and the increase of the heat radiation property. The epoxy resin B has a high heat-proof property and good electric properties such as dielectric constant, insulating resistance and withstand voltage margin, each of which is an important characteristic for realizing each function of individual insulating layers.

| (Contents of epoxy resin A) | |
|---|---|
| Bisphenol epoxy resin | 100 parts by weight |
| Bismule-imide-tri-azin resin | 30 parts |
| Di-cyan-di-amide (hardening material) | 6 parts |
| Imidazole (activator) | 0.2 parts |
| Acetone (solvent) | 90 parts |
| Methy-ethyl-ketone (solvent) | 100 parts |
| (Contents of epoxy resin B) | |
| Bromide epoxy resin | 100 parts by weight |
| Di-cyan-di-amide (hardening material) | 6 parts |
| Imidazole (activator) | 0.2 parts |
| Acetone (solvent) | 90 parts |
| Methy-ethyl-ketone (solvent) | 100 parts |

Heat transfer coefficient, defined by Kcal/mh° C., and breakdown voltage in KV of regions in the first insulating layer 24, the second insulating layers 23a and 23b, and the third insulating layers 25a and 25b are shown in Table 1.

TABLE 1

| | Heat Transfer Coefficient | Breakdown Voltage |
|---|---|---|
| Region in the 1st insulating layer | 10.1 | 10.6 |
| Region in the 2nd and 3rd insulating layers | 7.25 | 13.60 |

Seventh Embodiment

FIGS. 11A and 11B are a cross-sectional view of the metallic print board of the seventh embodiment of the present invention and a plan view of its insulating layer, respectively. In FIGS. 11A and 11B, component 21 is the third insulating layer formed between the 0.30 thick insulating layer 20 and the copper film 26. The third insulating layer is established by coating the above mentioned epoxy resin B in an aromatic polyamide non-textile fiber with 20 g/m² and 0.05 mm thickness.

Heat transfer coefficients defined by Kcal/mh° C., and breakdown voltage in KV of regions in the first insulating layer 24 and the second insulating layers 23a and 23b in FIGS. 11A and 11B, are shown in Table 2.

TABLE 2

| | Heat Transfer Coefficient | Breakdown Voltage |
|---|---|---|
| Region in the 1st and 3rd insulating layer | 8.90 | 12.5 |
| Region in the 2nd and 3rd insulating layers | 7.10 | 14.7 |

Epoxy resin A or other combination filling materials may be used for the third insulating layer as well as epoxy resin B. The insulation material between the metallic plate 27 and the copper film 26 may be formed only by the first and second insulating layers without using the third insulating layer.

Eighth Embodiment

FIGS. 12A and 12B are a cross-sectional view of the metallic printed board of the eighth embodiment of the present invention and a plan view of its insulating layer, respectively. The metallic board shown in FIGS. 12A and 12B has the same insulating structure as that used for the metallic board in the sixth embodiment, but the shape of the first insulating layer 24 is circular and the shapes of the second insulating layers 23a and 23b and the third insulating layers 25a and 25b are complementary ones to the shape of the first insulting layer 24.

Heat transfer coefficients, defined by Kcal/mh° C., and breakdown voltage in KV of regions in the first insulating layer 24, the second insulating layers 23a and 23b, and the third insulating layers 25a and 25b in the FIGS. 12A and 12B, are shown in Table 3.

TABLE 3

| | Heat Transfer Coefficient | Breakdown Voltage |
|---|---|---|
| Region in the 1st insulating layer | 10.5 | 10.55 |
| Region in the 2nd and 3rd insulating layers | 7.25 | 14.0 |

Ninth Embodiment

Figure 13:
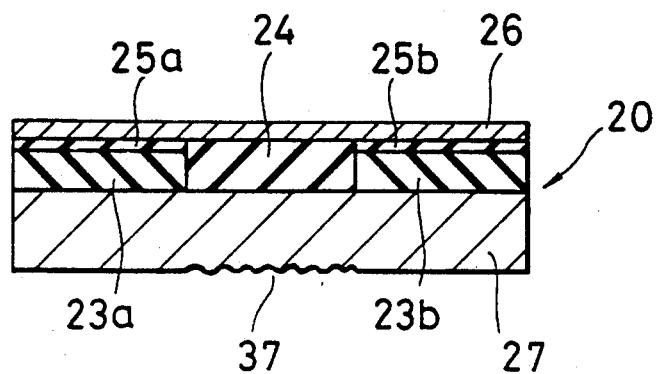
FIG. 13 is a cross-sectional view of a metallic board of ninth embodiment of the present invention.

FIG. 13 is a cross-sectional view of the metallic board of the ninth embodiment of the present invention. In FIG. 13, component 13 is a concave and convex surface formed on a back side of the metallic plate 27 under the first insulating layer 24. The surface on the back side of the metallic plate 27 corresponding to the second insulating layers 23a and 23b is made to be flat and smooth. In comparison with the second insulating layers 23a and 23b, the glass transition temperature of the first insulating layer 24 is 5° C. greater and its thermal expansion coefficient has 90% value. In this embodiment, as the surface on the back side portion of the metallic plate 27 under the first insulating layer 24 is formed to be a concave and convex face 37, the effective surface on the back side of the metallic plate 27 can be taken to be large enough to attain higher heat radiation property in relative to the embodiment shown in FIGS. 10A and 10B.

Tenth Embodiment

Figure 14:
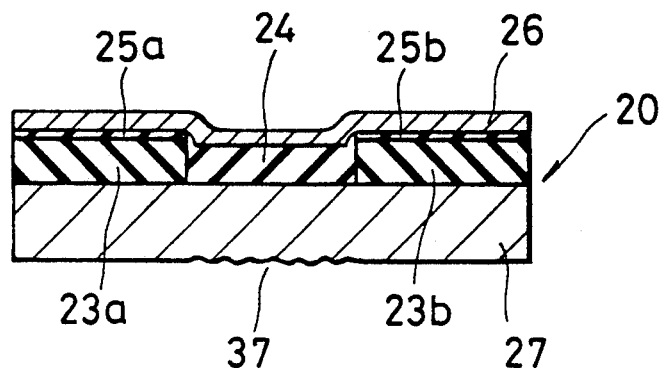
FIG. 14 is a cross-sectional view of a metallic board of tenth embodiment of the present invention.

FIG. 14 is a cross-sectional view of the metallic board of the tenth embodiment of the present invention. The thickness of the first insulating layer 24 is 0.26 mm and the thickness of the second insulating layers 23a and 23b is 0.3 mm. In this embodiment, the thickness of the first insulating layer 24 is taken to be less than or equal to 90% of the thickness of the second insulating layers 23*a* and 23*b*. In the same manner as the ninth embodiment, the surface on the back side of the metallic plate 27 corresponding to the first insulating layer 24 is formed to be a concave and convex face 37. In this embodiment, as the thickness of the first insulating layer 24 is less than the thickness of the second insulating layers 23*a* and 23*b*, the heat radiation efficiency can be further increased in comparison with the ninth embodiment. The insulating layers of this embodiment are made in such a manner that the epoxy resin without filling materials is coated in the glass non-textile fiber. In this embodiment, the heat transfer coefficients, defined by Kcal/mh° C., and breakdown voltage in KV of regions in the first insulating layer 24, are 5.85 and 14.8, respectively.

In the above embodiments, base materials used for insulating layers are glass non-textile fiber and aromatic polyamide fiber, and synthetic resins and/or inorganic filling materials are coated on the resin plate in order to finish the insulating layers. Any modification can be possible, for example, by only using aromatic polyamide non-textile fiber for forming insulating base materials. As for base materials for the insulating layers, fiber plates may be formed in either textiles or non-textiles.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A metallic printed board having layers including a metallic plate, an electric insulating layer and a metallic film, comprising:
   a plurality of insulating regions in said electric insulating layer, said plurality of insulating regions being formed respectively of a plurality of electric insulating materials, one of said plurality of electric insulating materials having a dielectric constant which is less than or equal to 5.0, another of said plurality of electric insulating materials having a thermal resistance which is less than or equal to 2.2° C/W said plurality of insulating regions being arranged on an identical plane surface of said metallic plate.

2. A metallic printed board as claimed in claim 1, wherein a plurality of circuits are arranged respectively on said plurality of insulating regions, one of said plurality of circuits having a signal frequency of 0–20 kHz and a power dissipation greater than 5W, another of said plurality of circuits having a signal frequency of 0–100 MHz and a power dissipation below 5W, said plurality of circuits being made of the metallic film.

3. A metallic printed board as claimed in claim 2, wherein a first circuit of said plurality of circuits is arranged on a first insulating region of said plurality of insulating regions, and a second circuit of said plurality of circuits is arranged on a second insulating region of said plurality of insulating regions, said first circuit having the power dissipation greater than 5W, said second circuit having the power dissipation below 5W, and said first insulating region having the thermal resistance which is less than or equal to 2.2° C/W.

4. A metallic printed board as claim in claim 3, wherein a surface on a back side of said metallic plate in an area corresponding to the area occupied by said first insulating region on the opposite surface of said metallic plate is a surface having concave and convex areas.

5. A metallic printed board as claimed in claim 4, wherein said first insulating region has a thickness which is less than or equal to 90% of a thickness of said second insulating region.

6. A metallic printed board as claimed in claim 2, wherein said metallic printed board comprises a structure having two types of device mounting parts, the device mounting parts including a single-sided and a double-sided device mounting part, and wherein a radiation fin is provided in contact with said single-sided device mounting part for reducing the thermal resistance of said single-sided device mounting part.

7. A metallic printed board as claimed in claim 1, wherein said metallic printed board is bent to form a case or a part of the structure of a case.

8. A metallic printed board having layers including a metallic plate, an electric insulating layer and a metallic film, comprising:
   a first insulating layer formed as a part of said electric insulating layer, said first insulating layer being composed of a glass non-textile fiber which is coated with a mixture of resin and inorganic filling materials including a aluminum oxide of between 50 parts and 70 parts by weight, silicon dioxide of between 1 part and 10 parts by weight, magnesium silicate of between 1 part and 10 parts by weight and thermoset resin of between 1 part and 10 parts by weight; and
   a second insulating layer formed as another part of said electric insulating layer and forming a continuous surface with said first insulating layer, said second insulating layer being composed of a glass non-textile fiber which is coated with a mixture of resin and inorganic filling materials including aluminum hydroxide of between 10 parts and 20 parts by weight, magnesium silicate of between 10 parts and 20 parts by weight, silicon dioxide of between 1 part and 5 parts by weight and thermoset resin of between 60 parts and 80 parts by weight.

9. A metallic printed board having layers including a metallic plate, an electric insulating layer and a metallic film, comprising:
   a first insulating layer formed as a part of said electric insulating layer, said first insulating layer being composed of a glass non-textile fiber which is coated with a mixture of resin and inorganic filling materials including aluminum oxide of between 50 parts and 70 parts by weight, silicon dioxide of between 1 part and 10 parts by weight, magnesium silicate of between 1 part and 10 parts by weight and thermoset resin of between 1 part and 10 parts by weight;
   a second insulating layer formed as another part of said electric insulating layer, said second insulating layer being disposed side by side with said first insulating layer, said second insulating layer being composed of a glass non-textile fiber which is coated with a mixture of resin and inorganic filling materials including aluminum hydroxide of between 10 parts and 20 parts by weight, magnesium silicate of between 10 parts and 20 parts by weight, silicon dioxide of between 1 part and 5 parts by weight and thermoset resin of between 60 parts and 80 parts by weight; and
   a third insulating layer forming another part of said electric insulating layer, disposed adjacent to and forming a continuous surface with said first insulating layer and developed on said second insulating layer, said third insulating layer being composed of an aromatic polyamide non-textile fiber which is coated with a thermoset resin.

10. A metallic printed board having layers including a metallic plate, an electric insulating layer and a metallic film, comprising:
a first insulating layer formed as a part of said electric insulating layer, said first insulating layer being composed of a glass non-textile fiber which is coated with a mixture of resin and inorganic filling materials including aluminum oxide of between 50 parts and 70 parts by weight, silicon dioxide of between 1 part and 10 parts by weight, magnesium silicate of between 1 part and 10 parts by weight and thermoset resin of between 1 part and 10 parts by weight;
a second insulating layer formed as another part of said electric insulating layer, disposed adjacent to and forming a continuous surface with said first insulating layer, said second insulating layer being composed of a glass non-textile fiber which is coated with a mixture of resin and inorganic filling materials including aluminum hydroxide of between 10 parts and 20 parts by weight, magnesium silicate of between 10 parts and 20 parts by weight, silicon dioxide of between 1 part and 5 parts by weight and thermoset resin of between 60 parts and 80 part by weight; and
a third insulating layer formed as another part of said electric insulating layer, said third insulating layer being developed on said identical surface defined by said first insulating layer and said second insulating layer, and being composed of an aromatic polyamide non-textile fiber which is coated with a thermosetting resin.

11. A metallic printed circuit board having layers including a metallic plate and an electric insulating layer, comprising:
a plurality of insulating regions in said electric insulating layer, said plurality of insulating regions being formed respectively of a plurality of electric insulating materials, said plurality of insulating regions being arranged on an identical plane surface of said metallic plate; and
a plurality of circuits being formed on an identical plane surface of said plurality of insulating regions, a respective one of said plurality of circuits being disposed so as to correspond to each of said plurality of insulating regions.

* * * * *